United States Patent [19]

Pezzani et al.

[11] Patent Number: 5,604,653
[45] Date of Patent: Feb. 18, 1997

[54] PROTECTION COMPONENT FOR A THREE-PHASE ALTERNATOR USED IN AUTOMOBILE VEHICLES

[75] Inventors: Robert Pezzani, Vouvray; Denis Berthiot, Tours, both of France

[73] Assignee: SGS-Thomson Microelectronics S.A., Saint Genis Pouilly, France

[21] Appl. No.: 217,393

[22] Filed: Mar. 24, 1994

[30] Foreign Application Priority Data

Apr. 9, 1993 [FR] France .................................. 93 04548

[51] Int. Cl.⁶ .................................................. H02H 7/125
[52] U.S. Cl. .............................. 361/20; 361/21; 361/33
[58] Field of Search .............................. 361/20, 21, 33, 361/111, 91, 56

[56] References Cited

U.S. PATENT DOCUMENTS 3,488,560  1/1970  Konopa .................................. 317/31
4,282,555  8/1981  Svedberg .............................. 361/56

*Primary Examiner*—Jeffrey A. Gaffin
*Assistant Examiner*—Sally C. Medley
*Attorney, Agent, or Firm*—David M. Driscoll; James H. Morris

[57] ABSTRACT

A three-phase alternator protection component is associated with a rectifying bridge. Three Shockley diodes and an avalanche diode are interconnected through three electrodes, of a first polarity, of the Shockley diodes, and the electrode, of the opposite polarity, of the avalanche diode to a common terminal that is connected to the output terminal, having a first polarity, of the rectifier. Each second electrode of the Shockley diodes is connected to each output of the alternator, and the second terminal of the avalanche diode is connected to the second output terminal of the rectifier.

41 Claims, 3 Drawing Sheets

PROTECTION COMPONENT FOR A THREE-PHASE ALTERNATOR USED IN AUTOMOBILE VEHICLES

BACKGROUND OF THE INVENTION

1. Field of the Invention

The present invention relates to three-phase alternators and more particularly to three-phase alternators used for charging the battery of automobile vehicles.

2. Discussion of the Related Art

FIG. 1 schematically represents a general diagram of a three-phase alternator used for charging an automobile battery. The alternator includes three induced windings L1, L2, L3 interconnected through one of their terminals and an induction coil L. The current in the induction coil L is set by a regulator (REG) that takes into account the current in the load in a way not represented. The output terminals S1, S2, S3 of the alternator are connected through diodes d1, d2, d3 to a first input of the regulator to feed it, and through a rectifying bridge to terminals $S^+$ and $S^-$ that are the positive and negative terminals of the battery B of the automobile vehicle and that are connected to various load circuits of the automobile vehicle. The rectifier includes diodes D1, D2, D3 connected by their anodes to the respective outputs S1, S2, S3 of the alternator and by their common cathodes to terminal $S^+$ (through a switch 1 switched on by the switch key), and includes diodes D4, D5, D6 that are connected by their cathodes to the respective outputs S1, S2, S3 and by their common anodes to terminal $S^-$.

A load indicator 2 is connected through an insulation diode 3 between terminal $S^+$ and the positive power supply of the regulator. The indicator 2 lights up when the voltage across the regulator becomes lower than the voltage of the battery, that is, in case of trouble or when the motor does not run although the contact is turned on.

The regulator operates to modulate the power provided by the alternator as a function of the required power. However, if the required power across terminals $S^+$, $S^-$ abruptly drops, for example because of a defective contact of the battery clips or because the lights of the vehicle are switched off, the regulator does not immediately operate and, during a period that is for example, approximately a few hundred milliseconds, the voltage across terminals S1, S2, S3, therefore across terminals $S^+$ and $S^-$, abruptly increases. Indeed, the power supply provided by the alternator did not change whereas the current abruptly dropped. This kind of voltage surge is commonly referred to as a "load dump". In the case of conventional automobile equipments, this phenomenon is not a significant problem. However, nowadays, the electric power available in automobile vehicles keeps increasing, and the trend is to incorporate an increasingly large number of active electronic components, realized in the form of integrated circuits. Such integrated circuits are very sensitive to overvoltage phenomena and to temporary overvoltage associated with the load dump, that can reach about 100 volts and may destroy the electronic components mounted on the vehicle, as well as in the regulator.

Various solutions have been proposed in the prior art to solve this problem.

A first known solution, illustrated in FIG. 2, consists in replacing each diode D1–D6 by an avalanche diode Z1–Z6 having a breakdown voltage higher than the maximum voltage across battery B. For the sake of safety, this breakdown threshold must be chosen substantially higher than the voltage of the battery. Thus, for a 12-volt battery, breakdown thresholds of approximately 30 volts are commonly chosen. An overvoltage occurring at one of terminals S1, S2, S3 is therefore clipped by one of the diodes.

A second conventional solution, illustrated in FIG. 3, consists in disposing an avalanche diode Z in parallel with battery B. This avalanche diode must also have a clipping breakdown threshold of approximately 30 volts.

The major drawback of these two solutions using clipping diodes is the dissipation problem due to the fact that the energy during the load dump phase is relatively high (approximately 100 joules), and substantially corresponds to the energy level of the load that has been abruptly interrupted. This energy is dissipated in the clipping diodes through which a high current will subsequently flow. This situation makes it necessary to use large-size diodes and/or to use several diodes in parallel and to associate other power dissipation heat sinks with these diodes. Thus, these solutions require the use of large-surface components associated with casings that are to be specifically mounted.

A third approach is described in U.S. Pat. No. 3,488,560. FIG. 2 of this patent is substantially similarly reproduced in the attached FIG. 4 with modifications in order to render its representation comparable with FIGS. 1–3. In this third solution, the load dump protection circuit is formed by three thyristors T1, T2, T3 that are connected between each output S7, S2, S3 of the alternator and terminal $S^-$. The gates of thyristors T1, T2, T3 are connected through resistors to the anode of an avalanche diode 5 whose cathode is connected to terminal $S^+$.

At the occurrence of a load dump, the voltage between terminals $S^+$ and $S^-$ rapidly increases. This voltage increase causes diode 5 to go to avalanche mode, and therefore causes the current to flow through the gates of thyristors T1, T2, T3. The thyristor having its anode connected to the most positive terminal amongst terminals S1, S2, S3 at the considered time starts conducting and the overvoltage is transmitted back into the other windings by at least one of diodes D4, D5, D6. Then, the thyristor stops conducting when its anode is no longer connected to a positive voltage, and the protection device is blocked if the overvoltage has ceased. Otherwise, another thyristor amongst thyristors T1, T2, T3 (the thyristor that is connected to the most positive terminal S1, S2, S3) relays the preceding thyristor.

An advantage of this third approach is the possibility of using thyristors which, when they are conductive, have a very low voltage drop at their terminals, dissipate little energy and thus can be small-size components that need not be mounted on heat sinks.

However, this third approach has two major drawbacks.

The first drawback of this approach lies in the complexity of its implementation, and the need for using and connecting a plurality of individual components, namely, at least one first component integrating the three thyristors T1, T2, T3 and a second component corresponding to diode 5 and, also, if necessary, additional components for the resistors.

The second drawback is that this approach does not protect the regulator against the mains overvoltages or, if it does, this protection impairs the operation of the circuit. Indeed, regardless of the load dump problems, the electric network of a vehicle may generate many perturbations resulting, for example, from ignition between an ignition coil and the spark plugs or from load variations. These phenomena generate short lasting pulses (a few microseconds) that can reach 300 volts. Such parasitic energy pulses remain however sufficiently energetic to damage the components mounted on the automobile vehicle and may be transmitted to the regulator through diode 3 and indicator 2, thus damaging the electronic circuits of the regulator. Such overvoltages are not clipped by the circuit of FIG. 4 in which diodes D1, D2, D3 block these overvoltages and prevent them from being eliminated by thyristors T1, T2, T3. Furthermore, these overvoltages cannot be eliminated by diode 5 and the gate-cathode path of thyristors T1, T2, T3 because of the presence of high series resistances.

SUMMARY OF THE INVENTION

Thus, an object of the invention is to provide a protection circuit both against the load dump phenomenon and overvoltages produced by the components mounted on an automobile vehicle, such a protection circuit having a small dissipation during the protection periods, and being carried out in the form of a monolithic component.

Another object of the invention is to provide a single component for protecting the vehicle alternator both against a load dump and overcharges occurring from the components of the vehicle.

To achieve these objects, the invention provides a protection component for a three-phase alternator associated with a rectifying bridge, including three Shockley diodes and an avalanche diode. Three electrodes, of a first polarity, of the Shockley diodes are interconnected with the electrode, having an opposite polarity, of the avalanche diode to a common terminal that is connected to the output terminal, having the first polarity, of the rectifier. Each second electrode of the Shockley diodes is connected to each output of the alternator, and the second terminal of the avalanche diode is connected to the second output terminal of the rectifier.

According to an embodiment of the invention, the first terminal of the avalanche diode is connected to the common terminal through a diode, which is forward-conducting when the avalanche diode is in avalanche mode.

According to an aspect of the invention, the protection component is formed in a substrate constituted by a layer of a first conductivity type and coated with a layer of the second conductivity type, and includes four wells of the first conductivity type that are formed in the layer of the second conductivity type; regions of the second conductivity type formed in three of the wells; front surface metallizations coating the apparent surfaces of the four wells; and a rear surface metallization coating the layer of the first conductivity type; whereby the rear surface metallization corresponds to the common terminal and the front surface metallizations correspond to the other electrodes of the Shockley diodes and of the avalanche diode, respectively.

According to an embodiment of the invention, the four wells have the same doping level.

According to an embodiment of the invention, the well corresponding to the avalanche diode is smaller than the other wells.

The foregoing and other objects, features, aspects and advantages of the invention will become apparent from the following detailed description of the present invention when taken in conjunction with the accompanying drawings.

DETAILED DESCRIPTION

The invention is based on an analysis of the existing protection circuits of a battery charging alternator and on modification and recombination of these circuits to achieve the above-mentioned objects.

More particularly, the invention aims at providing, as a main protection circuit against a load dump, protection components having, like thyristors, a breakover characteristic, that is, once such components are set to conduction state, they have a very low voltage drop across their terminals. However, since the prior art thyristors involve the use of a relatively complex circuit, the invention provides for replacing these thyristors by Shockley diodes or gateless thyristors that are components including four semiconductor layers of alternate conductivity types.

Figure 5:
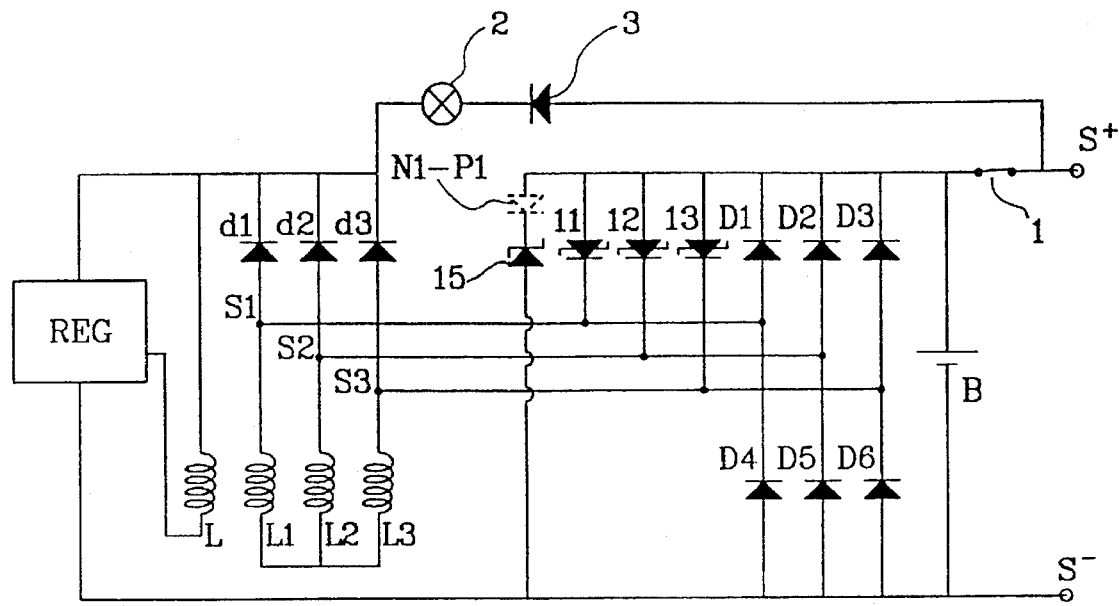
FIG. 5 represents an embodiment of a protection circuit according to the invention.

In the embodiment of FIG. 5, the Shockley diodes 11, 12, 13 are disposed between terminal S$^+$ and each terminal S1, S2, S3, respectively, of the alternator. The anodes of diodes 11, 12, 13 are therefore common and connected to terminal S$^+$.

In a way known per se, when a voltage positively increases between the anode and the cathode of a Shockley diode component, the current through the component is substantially zero until a so-called avalanche voltage, VBR, is reached. Then, the current increases relatively rapidly with the voltage up to a breakover voltage VBO; then, the voltage rapidly drops while the current may increase. The component is blocked again when the current that flows therethrough becomes lower than a hold current IH.

Components 11, 12, 13 are selected so that their avalanche voltage VBR is higher than the maximum voltage of the battery, and this breakover voltage VBO is lower than the maximum voltage that can be withstood by the circuits to be protected. In the case of a 12-volt battery, voltage VBR is selected higher than 16 volts (for example, 20 volts), and voltage VBO lower than 40 volts (for example, 28 volts). These components must be large enough to conduct the forward current established by the load dump energy that can reach approximately 100 amperes. In practical applications, the size of each component is much smaller than the size of a clipping diode withstanding an equal overcharge.

The operation of the protection device according to the invention will be disclosed while taking into account that there are sine wave alternate voltages out of phase by 120°, across the terminals of each winding S1, S2, S3. Thus, each diode D1, D2, D3 conducts current when the voltage across the corresponding terminal is maximum.

If a load dump occurs while diode D1 is conductive, the Shockley diode 12 or 13, which has the highest voltage difference across its terminals, is set to conduction state and the circuit is looped back on winding L2 and/or L3. This phenomenon is repeated with successive conduction of the Shockley diodes 11, 12, 13 until the voltage excursion provided by the alternator becomes lower than the breakover voltage of these diodes.

Therefore, the invention eliminates the load dump effect at terminals S$^+$ and S$^-$, and on the circuits to which they are connected by providing back the overvoltages produced by a winding of the alternator towards another winding of this alternator. It should be noted that a Shockley diode put in avalanche in response to the load dump effect is automatically switched off later on, due to the alternate polarities of the windings of the three-phase alternator.

Additionally, as represented in FIG. 5, the invention provides to dispose an avalanche diode 15 in parallel between terminals S+ and S− to eliminate the short overvoltages that can be generated by some of the electronic devices of the vehicle. Indeed, diodes D1–D6 are biased in such a way that a positive overvoltage occurring at terminal S+ cannot be eliminated by the Shockley diodes 11, 12, 13. In contrast, such an overvoltage sets to conduction state the avalanche diode 15 whose protection function is ensured by clipping the other electric components of the vehicle and of the regulator. Since the overvoltages generated by the electric components of the vehicle may have a high voltage, but a low energy, diode 15 may have a small size.

Diode 15 is not active in case of a load dump provided that it has an avalanche voltage higher than or equal to the breakover voltage of the Shockley diodes 11–13. If the avalanche voltage is equal to the breakover voltage, since an avalanche diode has a high dynamic resistance, its switching-on is immediately relayed by the switching-on of either one of the Shockley diodes 11–13. The voltage across diode 15 then becomes immediately lower than the avalanche voltage, and diode 15 turns off again.

Figure 4:
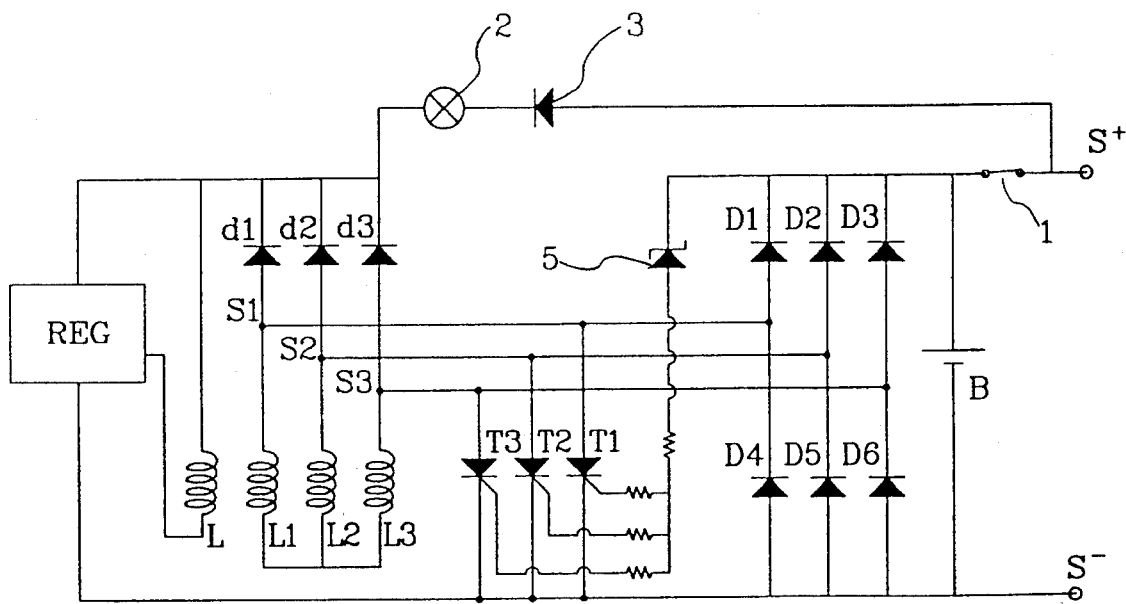

Thus, the circuit according to the invention has, like the prior art circuit illustrated with reference to FIG. 4, the advantage of using small-size components only and of ensuring a protection function against overvoltages occurring on the electric components of the vehicle, too. Additionally, as disclosed hereinafter, the circuit according to the invention can be fabricated in the form of a single component.

Figure 6:
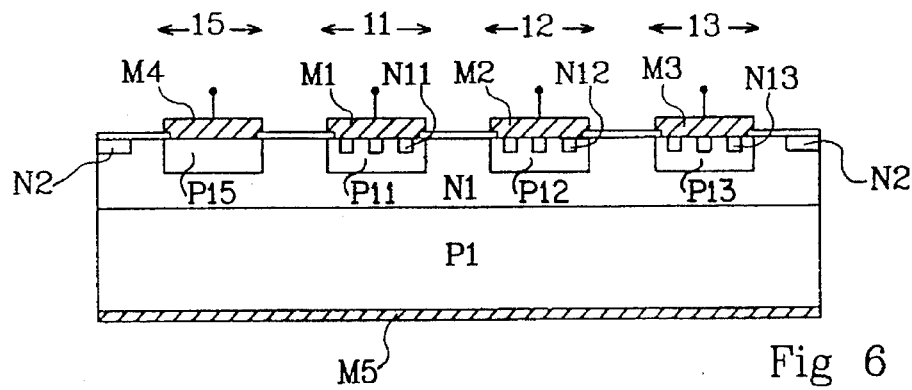
FIG. 6 is a schematic cross-sectional view of a protection component according to the invention.

FIG. 6 is a cross-sectional view of a monolithic component according to the invention integrating three Shockley diodes with a common anode and an avalanche diode having its cathode connected to the common anodes of the Shockley diodes. The monolithic component is fabricated using a substrate including a P-type lower layer, P1, and an N-type upper layer, N1. Layer N1 can be epitaxially grown over a P-type substrate, or one can start from an N-type substrate to form region P1 through a diffusion step. The dopant concentration in region P1 is approximately $10^{19}$ atoms/cm$^3$, and the dopant concentration in region N1 is approximately $10^{15}$ atoms/cm$^3$.

P-type wells P11, P12, P13, and P15, respectively, are diffused in region N1. In wells P11, P12, P13, there are respectively formed N-type regions N11, N12, N13. Metallizations M1, M2, M3, that coat the upper surface of wells P11, P12, P13, contact regions N11, N12, N13 and apparent portions of wells P11, P12, P13. A metallization M4 coats well P15. A metallization M5 coats the rear surface of layer P1.

Metallizations M1, M2, M3 respectively correspond to the cathode of the Shockley diodes 11, 12, 13 whose metallization M5 constitutes the common anode. Metallization M4 corresponds to the anode of an avalanche diode 15 whose cathode is formed by the layer N1 that is connected to metallization M5 through layer P1. Thus, in fact, there exists a junction N1-P1 forming a diode between the cathode of the avalanche diode 15 and the common metallization M4. Diode N1-P1 (represented in dashed lines in FIG. 5) has its cathode connected to the cathode of diode 15 and does not impair in any way the desired application since diode 15 is intended to operate in avalanche mode only as a protection component, and never in forward-conducting mode.

Wells P11, P12, P13, P15 can be fabricated during the same operation; then, they have identical breakover characteristics. The possibility of choosing the doping level of wells P11, P12, P13 with respect to the doping level of layer N1 allows, amongst other possibilities, for adjusting the voltage VBO of the Shockley diodes and the avalanche voltage of diode 15. Well P15 preferably has a smaller surface than wells P11–P13 in order to increase the dynamic resistance of the avalanche diode and to improve the initial triggering of the Shockley diodes in case of a load dump. Conventionally, in order to reach breakdown voltages ranging from 10 to 30 volts, the P-type wells have diffusion depths within the range of 5 to 15 μm for a surface concentration of approximately $10^{18}$ atoms/cm$^3$. Layer N1 conventionally has a depth of approximately 20–80 μm; regions N11, N12, N13 have surface concentrations of approximately $10^{20}$ atoms/cm$^3$ for a depth ranging from 1 to 5 μm.

FIG. 6 also shows an N-type overdoped guard ring N2, at the periphery of the component and a thin oxide layer (not referenced) on the upper surface of the component, outside the contact areas of metallizations M1–M4.

The component of FIG. 6 can then be conventionally accommodated in a casing provided with five connections that respectively correspond to metallizations M1–M5. The casing can be connected in the way illustrated in FIG. 5 to a three-phase alternator/rectifier assembly.

As is apparent to those skilled in the art, various modifications can be made to the present invention, more particularly for the fabrication of the component of FIG. 6. Furthermore, it should be noted that all the conductivity types of the component illustrated in FIG. 6 can be inverted to provide a protection component including three Shockley diodes with a common cathode and an avalanche diode whose anode is connected to these common cathodes. In that case, the Shockley diodes are connected between each output S1, S2, S3 of the alternator, and the output terminal S− of FIG. 5; then, the common metallization of the casing can be connected to the vehicle chassis ground.

Figure 1:
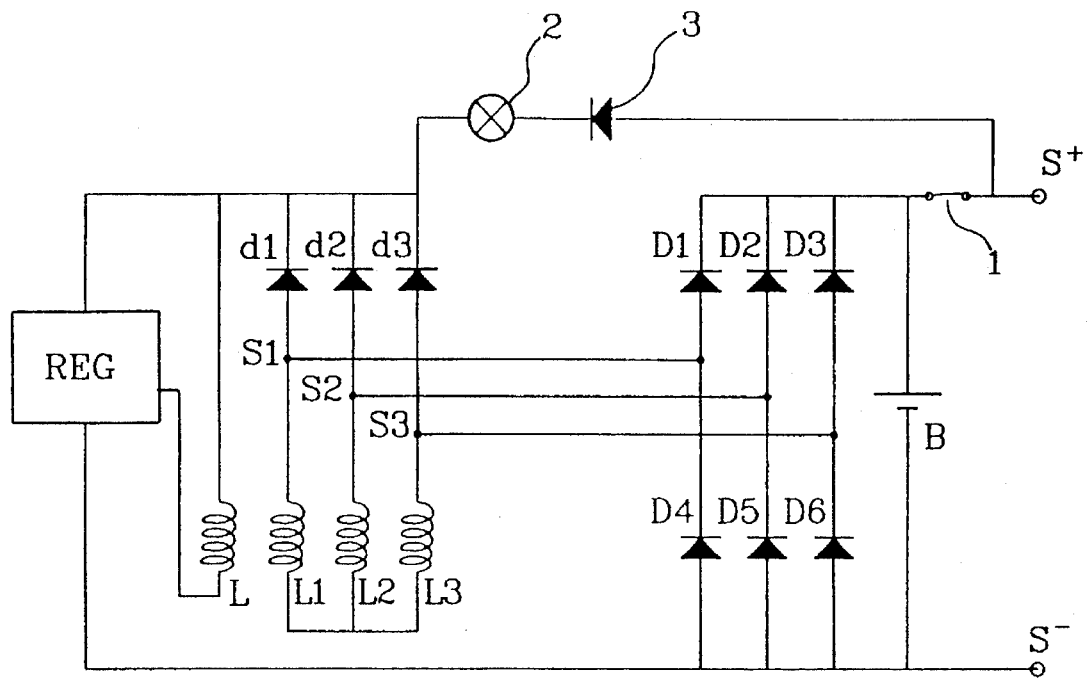
FIGS. 1–4, above described, illustrate conventional alternator circuits mounted on automobiles.
Figure 2:
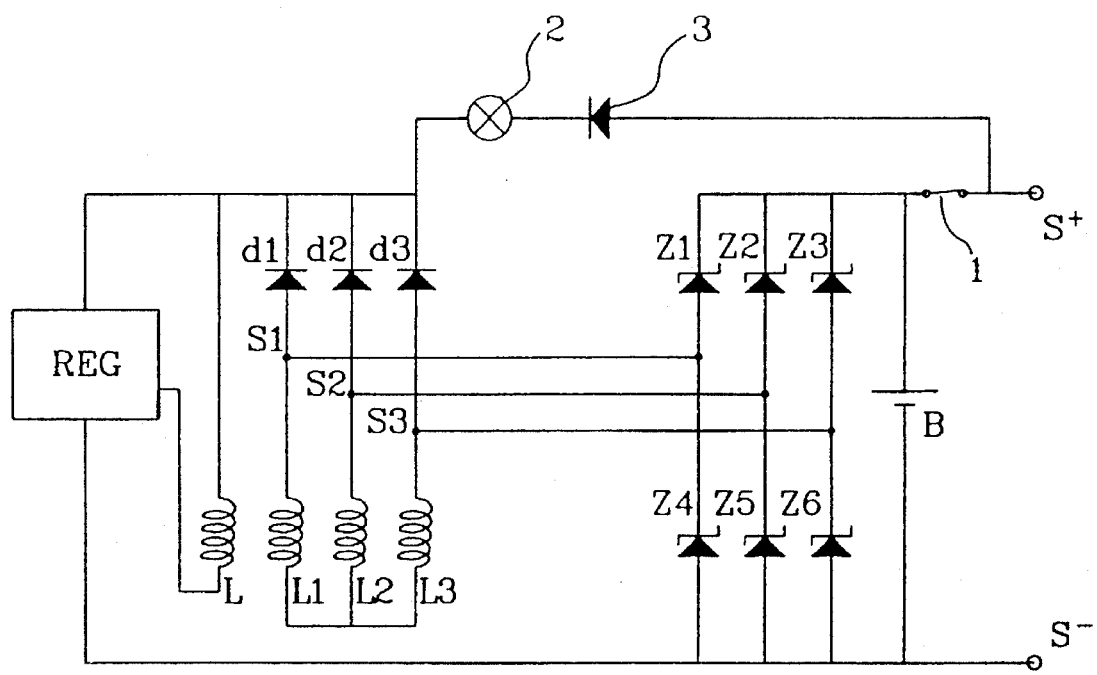
Figure 3:
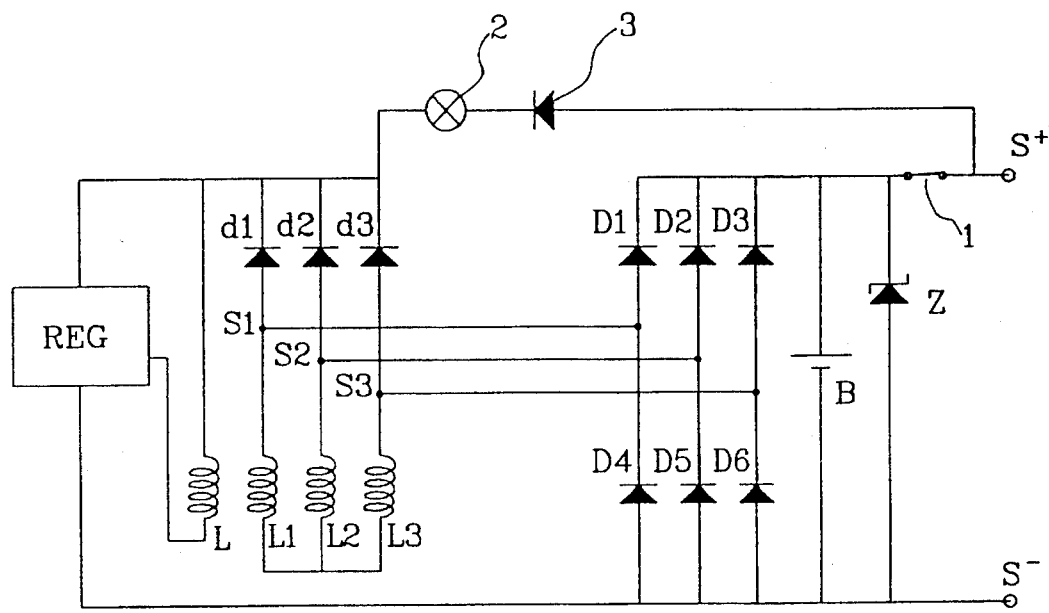
Figure 7:
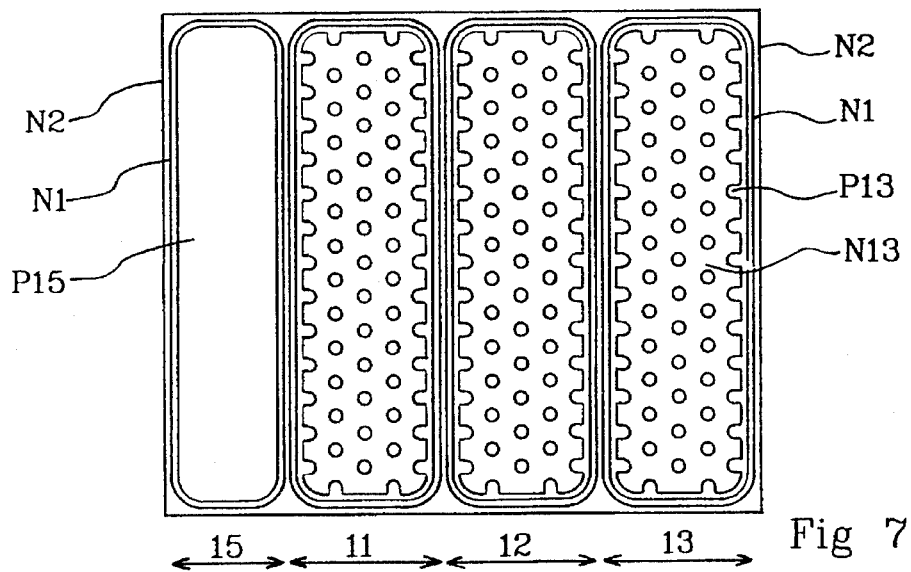
FIG. 7 is a top view of a protection component according to the invention.

FIG. 7 is an exemplary top view of a component according to the invention. This view does not exactly correspond to the cross-sectional view of FIG. 2. In particular, region N2 extends between each element of the component. By way of example, for an application to automobile vehicles, the surface of each Shockley diode 11, 12, 13 is approximately 6 mm$^2$ and the surface of the avalanche diode 15 is approximately 3 to 4 mm$^2$, that is, an overall component surface of approximately 25 mm$^2$. It should be noted that, for the same application, diode Z of FIG. 3 would have a surface two to three times larger.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A protection component for a three-phase alternator associated with a rectifier, including:

an avalanche diode having a first electrode with a first polarity and a second electrode with a second polarity;

a first Shockley diode having a first electrode of the first polarity that is interconnected with the second electrode of the avalanche diode: the first electrode also being interconnected to a common terminal that is connected to a first output terminal of the rectifier, the first output terminal having the first polarity; the first Shockley diode having a second electrode being connected to a first output of the three-phase alternator;

a second Shockley diode having a first electrode of the first polarity that is interconnected with the second electrode of the avalanche diode; the first electrode of the second Shockley diode also being interconnected to the common terminal; the second Shockley diode having a second electrode being connected to a second output of the three-phase alternator;

a third Shockley diode having a first electrode of the first polarity that is interconnected with the second electrode of the avalanche diode; the first electrode of the third Shockley diode also being interconnected to the common terminal; the third Shockley diode having a second electrode being connected to a third output of the three-phase alternator; and wherein the first electrode of the avalanche diode is connected to a second output terminal of the rectifier.

2. The protection component of claim 1, wherein a first terminal of the avalanche diode is connected to the common terminal through a further diode, which diode is forward-conducting when the avalanche diode is in avalanche mode.

3. The protection component of claim 2, comprising:

a substrate constituted by a layer of a first conductivity type coated with a layer of a second conductivity type, four wells of the first conductivity type formed in said layer of the second conductivity type, regions of the second conductivity type formed in three of said wells, front surface metallizations coating apparent surfaces of the four wells, and a rear surface metallization coating said layer of the first conductivity type, whereby the rear surface metallization corresponds to said common terminal and the front surface metallizations correspond to the second electrodes of the Shockley diodes and of the avalanche diode, respectively.

4. The protection component of claim 3, wherein said regions of the second conductivity type are provided with shorting holes.

5. The protection component of claim 3, wherein the four wells have a same doping level.

6. The protection component of claim 5, where one of the wells corresponding to the avalanche diode is smaller than other ones of the wells.

7. A protection component for a three-phase alternator associated with a rectifier, comprising:

a first Shockley diode, having an anode and a cathode, a second Shockley diode, having an anode and a cathode, a third Shockley diode, having an anode and a cathode, an avalanche diode, having an anode and a cathode, a first output terminal electrically coupled to the anode of the first Shockley diode, to the anode of the second Shockley diode, to the anode of the third Shockley diode, to a first output of the rectifier, and to the cathode of the avalanche diode, a second output terminal electrically coupled to the cathode of the first Shockley diode and to a first output terminal of the three-phase alternator, a third output terminal electrically coupled to the cathode of the second Shockley diode and to a second output terminal of the three-phase alternator, a fourth output terminal electrically coupled to the cathode of the third Shockley diode and to a third output terminal of the three-phase alternator, and a fifth output terminal electrically coupled to the anode of the avalanche diode and to a second output of the rectifier.

8. The component of claim 7 wherein the first, second, and third Shockley diodes and the avalanche diode are part of a same monolithic structure.

9. The protection component of claim 7 wherein the first and fifth output terminals are provided respectively to first and second terminals of a battery.

10. The protection component of claim 7 wherein the Shockley diodes have an avalanche voltage higher than a maximum voltage of a battery and a breakover voltage lower than a maximum voltage of a circuit to be protected.

11. The protection component of claim 7 wherein the second, third, and fourth output terminals are provided to input terminals of the rectifier.

12. The protection component of claim 7, further including a further diode between the cathode of the avalanche diode and the first output terminal, which further diode is forward-conducting when the avalanche diode is in avalanche mode.

13. The protection component of claim 7, comprising:

a substrate constituted by a layer of a first conductivity type coated with a layer of a second conductivity type, wells of the first conductivity type formed in said layer of the second conductivity type, regions of the second conductivity type formed in one of said wells, front surface metallizations coating apparent surfaces of the wells, and a rear surface metallization coating said layer of the first conductivity type, whereby the rear surface metallization corresponds to the first terminal and the front surface metallizations correspond to the second and third terminals.

14. The protection component of claim 13, wherein the wells have a same doping level.

15. The protection component of claim 14, where one of the wells corresponding to the avalanche diode is smaller than another of the wells.

16. The protection component of claim 13, wherein said regions of the second conductivity type are provided with shorting holes.

17. The component claim 7 wherein the first, second, and third Shockley diodes and the avalanche diode are part of a same monolithic structure, and further including a further diode between the cathode of the avalanche diode and the first output terminal, which further diode is forward-conducting when the avalanche diode is in avalanche mode.

18. The protection component of claim 17 wherein the first and fifth output terminals are provided respectively to first and second terminals of a battery.

19. The protection component of claim 18 wherein the Shockley diodes have an avalanche voltage higher than a maximum voltage of the battery and a breakover voltage lower than a maximum voltage of circuits to be protected.

20. The protection component of claim 19 wherein the second, third, and fourth terminals are provided to input terminals of the rectifier.

21. The protection component of claim 17, comprising:

a substrate constituted by a layer of a first conductivity type coated with a layer of a second conductivity type, four wells of the first conductivity type formed in said layer of the second conductivity type, regions of the second conductivity type formed in three of said wells, front surface metallizations coating apparent surfaces of the four wells, and a rear surface metallization coating said layer of the first conductivity type, whereby the rear surface metallization corresponds to the first terminal and the front surface metallizations correspond to the second, third, fourth and fifth terminals.

22. The protection component of claim 21, wherein said regions of the second conductivity type are provided with shorting holes.

23. The protection component of claim 21, wherein the four wells have a same doping level.

24. The protection component of claim 23, where one of the wells corresponding to the avalanche diode is smaller than others of the wells.

25. A method of protecting circuitry associated with a three-phase alternator and a rectifier, comprising:

a step of generating current in a first coil in the three-phase alternator, a step of generating current in a second coil in the three-phase alternator, a step of generating current in a third coil in the three-phase alternator, a step of rectifying the current generated in the first, second, and third coils, a step of drawing the current generated in the step, of generating and rectified in the step of rectifying into a load, a step of redirecting a lead dump current into one of the first, second and third coils via a first circuit path including a first Shockley diode in an electronic component.

a step of redirecting a load dump current into one of the first, second and third coils via a second circuit path including a second Shockley diode in an electronic component, a step of redirecting a load dump current into one of the first, second and third coils via a third circuit path including a third Shockley diode in all electronic component, and a step of clipping overvoltages on the load via a fourth circuit path by an avalanche diode in the same electronic component.

26. The method of claim 25, further including the step of regulating the steps of generating.

27. The method of claim 26, further including the step of charging a battery with the current.

28. The method of claim 27 wherein the steps are performed for an automobile.

29. The method of claim 28 wherein the steps of redirecting and clipping are performed by the same monolithic structure.

30. The method of claim 25, further including the step of charging a battery with the current.

31. The method of claim 25 wherein the steps are performed for an automobile.

32. The method of claim 25 wherein the steps of redirecting and clipping are performed by the operation of circuitry implemented by a same monolithic structure in the component.

33. A component for protecting circuitry including a three-phase alternator, a rectifier, and a load comprising:

first Shockley diode means for redirecting load dump current, having an anode and a cathode, second Shockley diode means for redirecting load dump current, having an anode and a cathode, third Shockley diode means for redirecting load dump current, having an anode and a cathode, avalanche diode means for clipping overvoltages on the load, having an anode and a cathode, a first output terminal means electrically coupled to the anode of the first Shockley diode, to the anode of the second Shockley diode, to the anode of the third Shockley diode, to a first output of the rectifier, and to the cathode of the avalanche diode, a second output terminal means electrically coupled to the cathode of the first Shockley diode, and to a first output terminal of the three-phase alternator, a third output terminal means electrically coupled to the cathode of the second Shockley diode, and to a second output terminal of the three-phase alternator, a fourth output terminal means electrically coupled to the cathode of the third Shockley diode, and to a third output terminal of the three-phase alternator, and a fifth output terminal means electrically coupled to the anode of the avalanche diode and to a second output of the rectifier.

34. The component of claim 33 wherein the first, second, and third Shockley diode means and the avalanche diode means are part of a same monolithic structure and further including a further diode means between the cathode of the avalanche diode means and the first output terminal means which further diode means is forward-conducting when the avalanche diode means is in avalanche mode.

35. The protection component of claim 34 wherein the first and fifth output terminal means are provided respectively to first and second terminals of a battery.

36. The protection component of claim 35 wherein each of the Shockley diode means has an avalanche voltage higher than a maximum voltage of the battery and a breakover voltage lower than a maximum voltage of a circuit to be protected.

37. The protection component of claim 35 wherein the second, third, and fourth output terminal means are provided to input terminals of the rectifier.

38. The protection component of claim 34, comprising:

a substrate constituted by a layer of a first conductivity type coated with a layer of a second conductivity type, four wells of the first conductivity type formed in said layer of the second conductivity type, regions of the second conductivity type formed in three of said wells, front surface metallizations coating apparent surfaces of the four wells, and a rear surface metallization coating said layer of the first conductivity type, whereby the rear surface metallization corresponds to the first terminal means and the front surface metallizations correspond to the second, third, fourth and fifth terminal means.

39. The protection component of claim 38, wherein said regions of the second conductivity type are provided with shorting holes.

40. The protection component of claim 38, wherein the four wells have a same doping level.

41. The protection component of claim 40, where one of the wells corresponding to the avalanche diode means is smaller than others of the wells.

* * * * *